United States Patent
Ogatsu

(10) Patent No.: US 9,432,491 B2
(45) Date of Patent: Aug. 30, 2016

(54) WATERPROOF STRUCTURE

(75) Inventor: Toshinobu Ogatsu, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 13/255,415

(22) PCT Filed: Apr. 12, 2010

(86) PCT No.: PCT/JP2010/002651
§ 371 (c)(1),
(2), (4) Date: Sep. 8, 2011

(87) PCT Pub. No.: WO2010/119663
PCT Pub. Date: Oct. 21, 2010

(65) Prior Publication Data
US 2012/0001525 A1    Jan. 5, 2012

(30) Foreign Application Priority Data
Apr. 15, 2009 (JP) .................. 2009-098973

(51) Int. Cl.
*H05K 5/02* (2006.01)
*H04M 1/18* (2006.01)
*H04B 1/3888* (2015.01)
*H04M 1/02* (2006.01)
*H05K 5/06* (2006.01)

(52) U.S. Cl.
CPC ............. *H04M 1/18* (2013.01); *H04B 1/3888* (2013.01); *H04M 1/0216* (2013.01); *H05K 5/063* (2013.01)

(58) Field of Classification Search
CPC .... H05K 5/063; H04M 1/18; H04M 1/0216; H04B 1/3888

USPC .......... 220/4.21–4.23, 3.94, 4.02, 4.24, 677, 220/681, 692, 693, 378; 206/811; 455/575.8, 575.1; 312/223.1, 223.4
See application file for complete search history.

(56) References Cited

U.S. PATENT DOCUMENTS

| | | | | |
|---|---|---|---|---|
| 5,199,239 A | * | 4/1993 | Younger | 52/592.5 |
| 5,914,159 A | * | 6/1999 | Kato | 428/34.1 |
| 6,467,876 B1 | * | 10/2002 | Karasawa et al. | 347/45 |
| 7,063,212 B2 | * | 6/2006 | Ordonez | 206/703 |
| 2005/0225952 A1 | * | 10/2005 | Takagi | 361/749 |
| 2006/0115598 A1 | | 6/2006 | Kaneko et al. | |
| 2007/0227873 A1 | * | 10/2007 | Kawasaki et al. | 200/443 |
| 2009/0127561 A1 | * | 5/2009 | Shiomi et al. | 257/66 |
| 2010/0324507 A1 | * | 12/2010 | Maier | 604/289 |

FOREIGN PATENT DOCUMENTS

| | | |
|---|---|---|
| JP | 9-067456 | 3/1997 |
| JP | 2006-175657 | 7/2006 |

(Continued)

OTHER PUBLICATIONS

English Machine Translation for JP 9067456.*
International Search Report, PCT/JP2010/002651, May 18, 2010.

*Primary Examiner* — Fenn Mathew
*Assistant Examiner* — Robert Stodola
(74) *Attorney, Agent, or Firm* — Young & Thompson

(57) ABSTRACT

A waterproof structure includes a casing including a first case member having a first facing surface, and a second case member having a second facing surface. A water repellent slit is provided on at least either one of the first and second facing surfaces, extends in one direction perpendicular to a direction of liquid droplet ingress, and has unidirectional fine recesses and protrusions that make water repellency anisotropic.

17 Claims, 14 Drawing Sheets

(56) References Cited

FOREIGN PATENT DOCUMENTS

| JP | 2006-235746 | 9/2006 |
| JP | 2007-312255 | 11/2007 |
| JP | 2008-092096 | 4/2008 |
| JP | 2009-028994 | 2/2009 |

* cited by examiner (Related Art)

WATERPROOF STRUCTURE

TECHNICAL FIELD

The present invention relates to a waterproof structure to be applied to a casing of a portable device.

BACKGROUND ART

In recent years, in portable devices such as mobile phones, mobile information terminals, digital cameras, and laptop type personal computers, the respective original functions such as a telephony calling function, schedule management, and document creation are becoming more multi-functional and exceeding their functional boundaries. For example, on a mobile phone, in addition to email transmitting/receiving functions, there have been added various types of functions such as a website viewing function, a gaming function, and a television watching function.

Under these circumstances, mobile terminals have become deeply rooted into our lives, and the level of the need for always having them is becoming higher as a result. For example, use of mobile terminals in outdoor areas, under rainy weather conditions, or during outdoor activities may be assumed. In order to ensure reliability under these types of conditions, there is a strong demand for an environment-adapting waterproofing property to be provided in mobile terminals.

Consequently, various types of waterproof structures have been proposed. In general, it is necessary to seal out liquid droplets in order to ensure waterproofness. Accordingly, there is widely known a packing structure in which a rubber based material such an O-ring is compressed and deformed, and the repulsive force thereof is used to bring it into close contact with a casing, to thereby ensure sealing. A packing structure uses repulsive force which is exerted when being compressed, and therefore, a compressing load is required. Various schemes have been proposed in order to reduce this load.

For example, in a portable information processing device disclosed in Patent Document 1, between an information input means on an information display means serving as a casing, and an external casing, there is provided a flexible TP cushion including a protruding waterproof rib and a concave waterproof groove. In a waterproof structure realized by means of the packing disclosed in Patent Document 2, between casing members forming a casing, there is provided a packing including an elastic ring. In a waterproof structure disclosed in Patent Document 3, a packing is provided on an outer periphery part between a front casing and a rear casing forming a casing. In a waterproof structure disclosed in Patent Document 4, no packing is used on the facing surface of a member which forms a casing, and waterproofness is ensured by coating it with a water repellent film.

PRIOR ART DOCUMENT

Patent Documents

[Patent Document 1] Japanese Unexamined Patent Application, First Publication No. 2006-235746
[Patent Document 2] Japanese Unexamined Patent Application, First Publication No. 2007-312255
[Patent Document 3] Japanese Unexamined Patent Application, First Publication No. 2008-92096
[Patent Document 4] Japanese Unexamined Patent Application, First Publication No. H09-67456

SUMMARY OF THE INVENTION

Problem to be Solved by the Invention

The waterproof mechanisms disclosed in these Patent Documents have some problems.

A first problem is that in waterproof structures with use of a flexible TP cushion, O-ring, or rubber packing (hereunder, referred to as sealing member) represented by those disclosed in Patent Documents 1 through 3, there is required a load for compressing these rubber based components, and therefore, a repulsive force against the compressing load needs to be exerted on the casing side. Further, the casing needs to have an appropriate level of strength so that it will not be deformed by the repulsive force, and this consequently becomes an obstacle to size reduction, thickness reduction, and weight reduction, which are required in portable devices.

A second problem is that providing a space required for arranging a sealing member leads to an increase in the size of a device, and this consequently becomes an obstacle to size reduction and thickness reduction. The volume required for providing this space includes the volume of a sealing member itself and the volume of a rib portion installed for fixing the sealing member.

A third problem is that performance becomes deteriorated over time due to deterioration in the sealing member. A prerequisite in a case of using a rubber product in a compressed state is that the level of elastic force stays unchanged. However, in reality, rubber products become deteriorated due to moisture in the air, ultraviolet rays, and so forth, and therefore the level of elastic force relatively decreases. Therefore, the sealing member needs to be replaced periodically in order to maintain the level of performance. Consequently, the level of usability for users is reduced, running costs arise, and there occurs a need for designing a structure for allowing replacement to be performed easily.

A fourth problem is that if handling is to be exercised with use of a water repellent film as illustrated in Patent Document 4, the obtained level of waterproofness may be considerably lower in some cases than for a sealing member such as an O-ring and rubber packing. That is to say, while IPX7 equivalent in degrees of protection provided by enclosures for electrical machinery and apparatuses (JIS C 0920) of JIS standard is possible when using a sealing member such as an O-ring and rubber packing, it is difficult, when a water repellent film is used, to realize IPX7 equivalent, which is required in a situation where hydraulic pressure is present. In Patent Document 4 in particular, a gap of approximately 0.5 mm to 0.6 mm is provided, and therefore, it is highly likely that water will pass through between the casing members not only at a static hydraulic pressure but also by a stream of water if it is radiated perpendicularly. Accordingly, this is considered imperfect in terms of waterproof performance.

A fifth problem is that liquid droplets may still attach thereon within a contact angle range of 130° or less, even with a water repellent film such as the one disclosed in Patent Document 4. As a result, liquid droplets attached on the water repellent film surface maintain their near spherical shape, and therefore evaporation thereof delays. Consequently, dust from the liquid droplets remaining on the water repellent film surface becomes attached, and the level of water repellency becomes deteriorated as a result.

The present invention takes into consideration the above circumstances, with an object of providing a waterproof structure capable of: realizing a high level of water repellency without use of a sealing member such as a cushion, an O-ring, or a rubber packing, or without use of a special water repellent film; and enabling quick evaporation of any entered liquid droplets.

Means for Solving the Problem

In order to solve the above problems, a waterproof structure according to the present invention includes a casing including a first case member having a first facing surface, and a second case member having a second facing surface. A water repellent slit is provided on at least either one of the first and second facing surfaces, extends in one direction perpendicular to a direction of liquid droplet ingress, and has unidirectional fine recesses and protrusions that make water repellency anisotropic.

Effect of the Invention

According to a waterproof structure of an exemplary embodiment of the present invention, a water repellent slit is provided on at least either one of the first and second facing surfaces, extends in one direction perpendicular to a direction of liquid droplet ingress, and has unidirectional fine recesses and protrusions that make water repellency anisotropic, and therefore, the following effect can be obtained. (1) It is possible, for example, to increase the level of water repellency with respect to the direction of liquid droplet ingress. A higher level of water repellent performance can be provided compared to that of a normal water repellent film. When comparing it in terms of contact angle, according to the waterproof structure of the exemplary embodiment of the present invention, contact angle is expected to be greater than that with a normal water repellent film by approximately 10° to 30°. As a result, in a case where the contact angle between water and a water repellent film coated on a flat surface with nothing applied thereon is 120°, it is possible, with fine recesses and protrusions, to make the contact angle 130° to 150° according to the waterproof structure of the exemplary embodiment of the present invention. (2) The waterproof structure of the exemplary embodiment of the present invention is highly resistant to deformation caused by external forces and is capable of maintaining water repellent performance for a prolonged period of time, compared to conventional waterproof structures having fine acicular protrusions, which are prone to deformation and may deteriorate the level of water repellent performance. (3) With the waterproof structure of the exemplary embodiment of the present invention, water repellent properties can be expected due to the shape of the recesses and protrusions on the surface, even without a water repellent film coating. At this time, if the recesses and protrusions on the slit are miniaturized to micrometer scale dimensions and made highly dense, a high level of water repellency and directivity can be obtained regardless of the materials. Moreover, with use of a fluorine based resin or a material such as a simple resin with contact angle of 90° or more, a sufficiently high level of water repellency can be obtained even if the surface recesses and protrusions are of several tens of micrometers scale dimensions. (4) According to the waterproof structure of the exemplary embodiment of the present invention, while a high level of water repellency in relation to the direction of liquid droplet ingress into a gap between the facing surfaces of the casing members is realized, it is possible to suppress water repellency in relation to the direction along the slit perpendicular to the ingress direction. As a result, a liquid droplet which has entered the gap between the facing surfaces of the casing members becomes oval-shaped, and therefore, the superficial area of the liquid droplet becomes large. Accordingly, it is possible to quickly evaporate the entered liquid droplet. (5) According to the waterproof structure of the exemplary embodiment of the present invention, it is possible to easily move a liquid droplet in a direction along the slit. Therefore, it is possible to quickly guide the entered liquid droplet to the outside of the casing members.

EMBODIMENTS FOR CARRYING OUT THE INVENTION

[First Exemplary Embodiment]

A first exemplary embodiment of the present invention is described, with reference to FIG. 1 through FIG. 12. FIG. 1 through FIG. 4 respectively show a casing 1 of a portable device.

FIG. 3 A is a front view showing the casing 1. FIG. 3B is a plan view of the casing 1 seen from the upper side of FIG. 3A. FIG. 3C is a side view of the casing 1 seen from the right side of FIG. 3A. FIG. 3D is a rear view of the casing 1 shown in FIG. 3A.

The casing 1 includes a lower casing (first casing member) 2 and an upper casing (second casing member) 3 serving as casing members. Inside the lower casing 2, there are formed bosses 2A. Inside the upper casing 3, there are formed bosses 3A. In a state where bosses 2A and bosses 3A are in contact with each other, screws 4 firmly fix the lower casing 2 and the upper casing 3 to each other.

Figure 1:
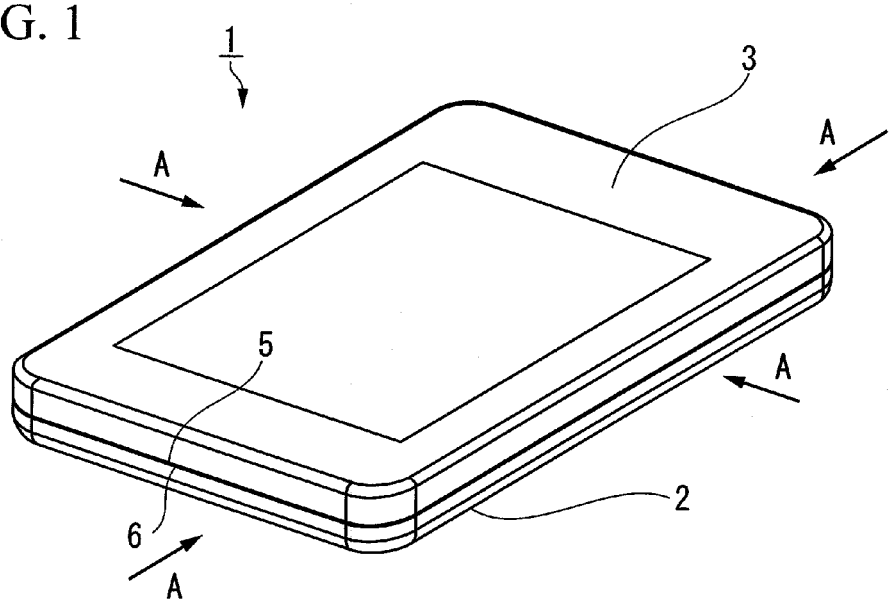
FIG. 1 is a perspective view showing an external appearance of a casing of a portable device according to a first exemplary embodiment of the present invention.
Figure 2:
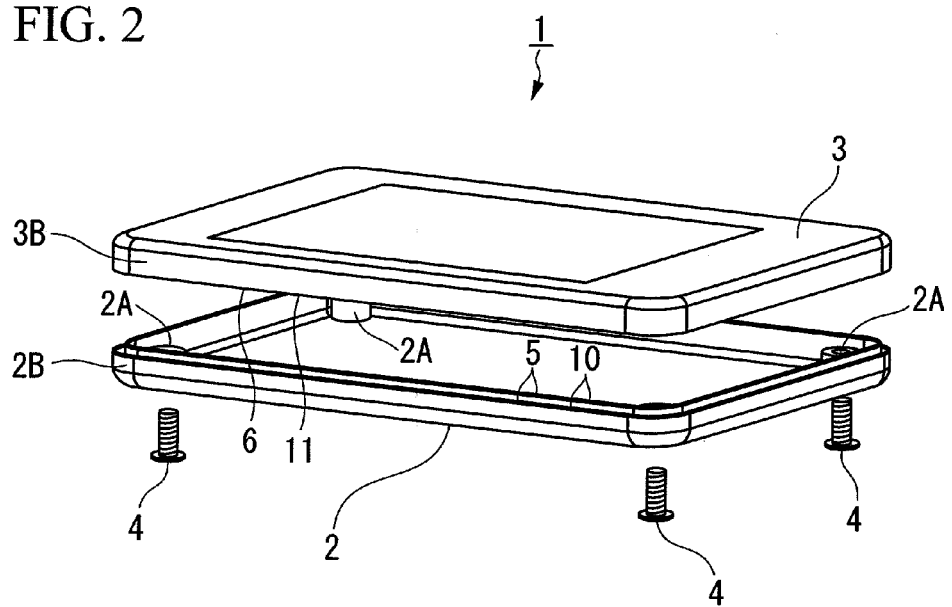
FIG. 2 is a perspective view showing casing members which constitute the casing shown in FIG. 1 in a state of being disassembled.
Figure 3A:
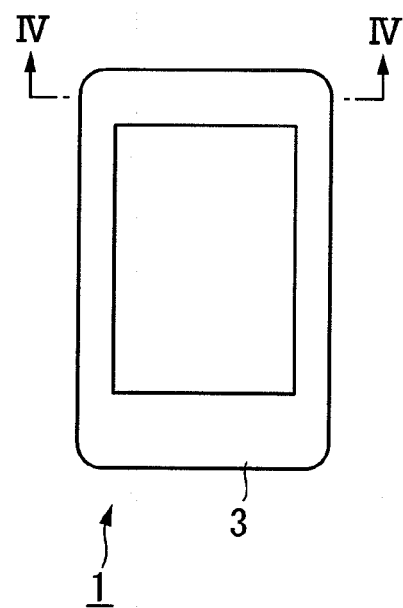
FIG. 3A is a front view showing the casing shown in FIG. 1.
Figure 3B:
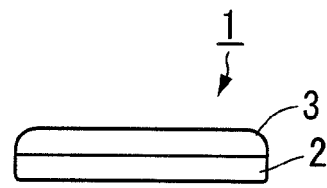
FIG. 3B is a plan view of the casing seen from the upper side of FIG. 3A.
Figure 3C:
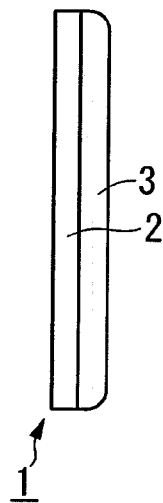
FIG. 3C is a side view of the casing seen from the right side of FIG. 3A.
Figure 3D:
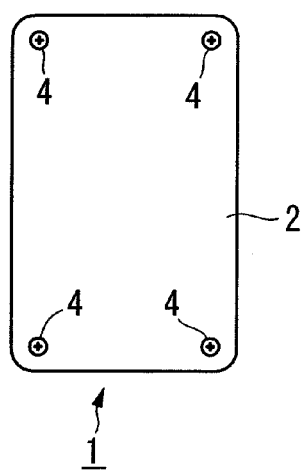
FIG. 3D is a rear view of the casing shown in FIG. 3A.
Figure 4:
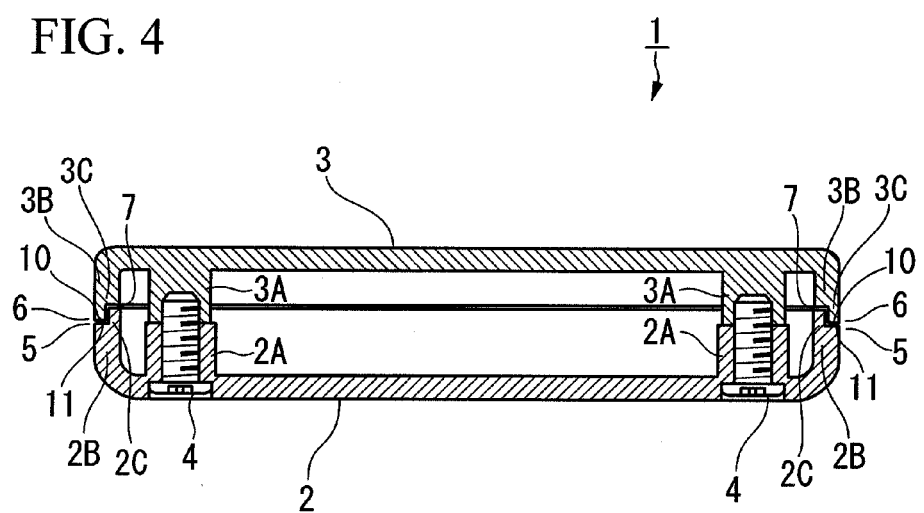
FIG. 4 is a cross-sectional view taken along line IV-IV in FIG. 3A.
Figure 5:
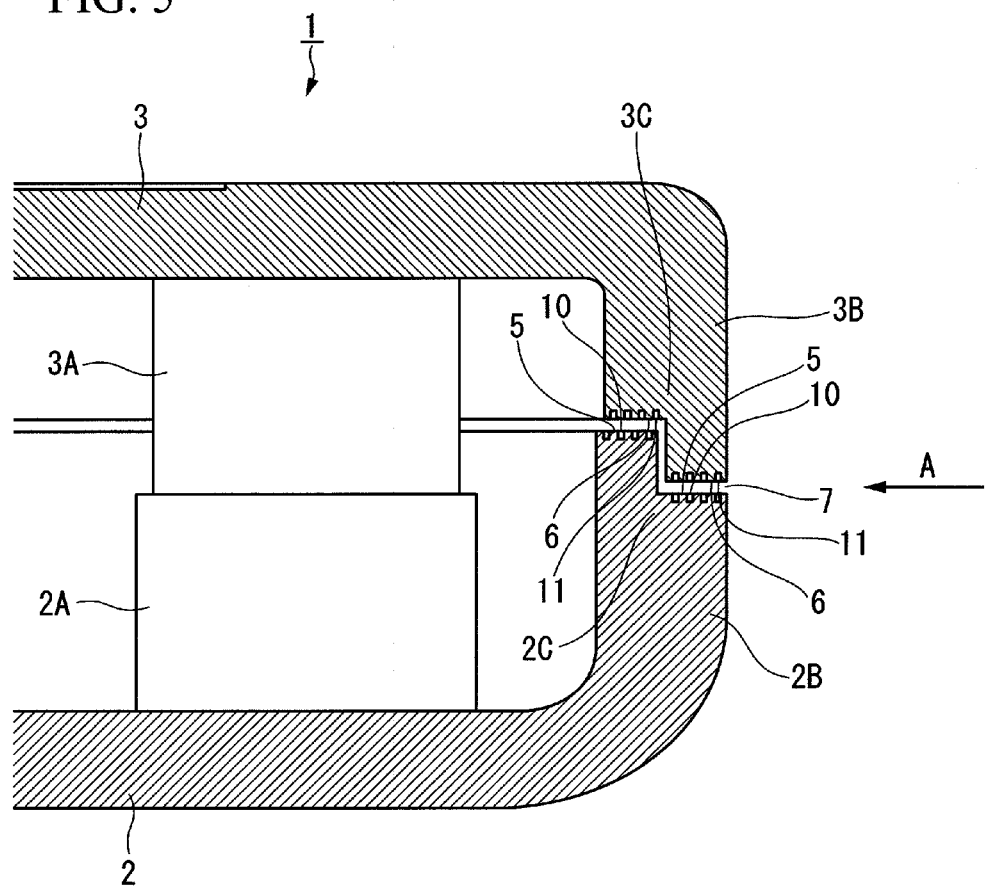
FIG. 5 is an enlarged cross-sectional view showing the proximity of facing surfaces of the casing members shown in FIG. 3A.

On a periphery part 2B of the lower casing 2, there is formed a facing surface (first facing surface) 5 where the lower casing 2 and the upper casing 3 are joined with each other. On a periphery part 3B of the upper casing 3, there is formed a facing surface (second facing surface) 6 where the lower casing 2 and the upper casing 3 are joined with each other. On the periphery part 2B of the lower casing 2, there is formed a step 2C. On the periphery part 3B of the upper casing 3, there is formed a step 3C. As shown in FIG. 4 and FIG. 5, the facing surfaces 5 and 6 are formed as the step 2C and the step 3C interlocking with other. Between the facing surfaces 5 and 6, there is formed a gap 7 to ensure manufacturing precision for preventing deformation in the casing 1 when fixing with the screws 4. This gap 7 is required to be up to 0.2 mm, taking manufacturing precision into consideration.

Figure 6:
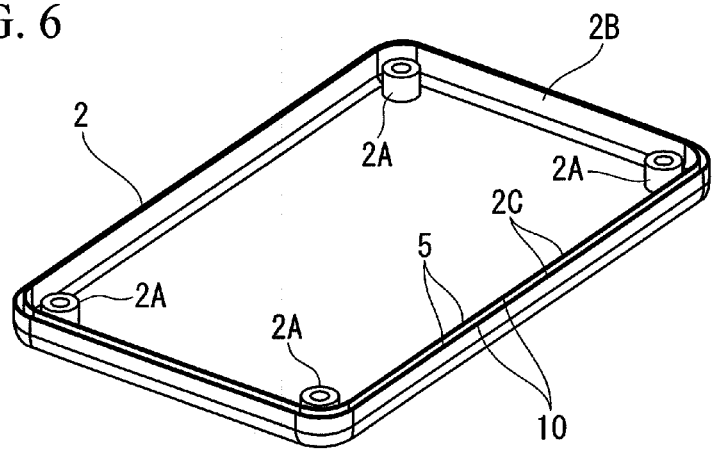
FIG. 6 is a perspective view showing the entirety of a lower casing of the casing shown in FIG. 1 which serves as one of the casing members.
Figure 7:
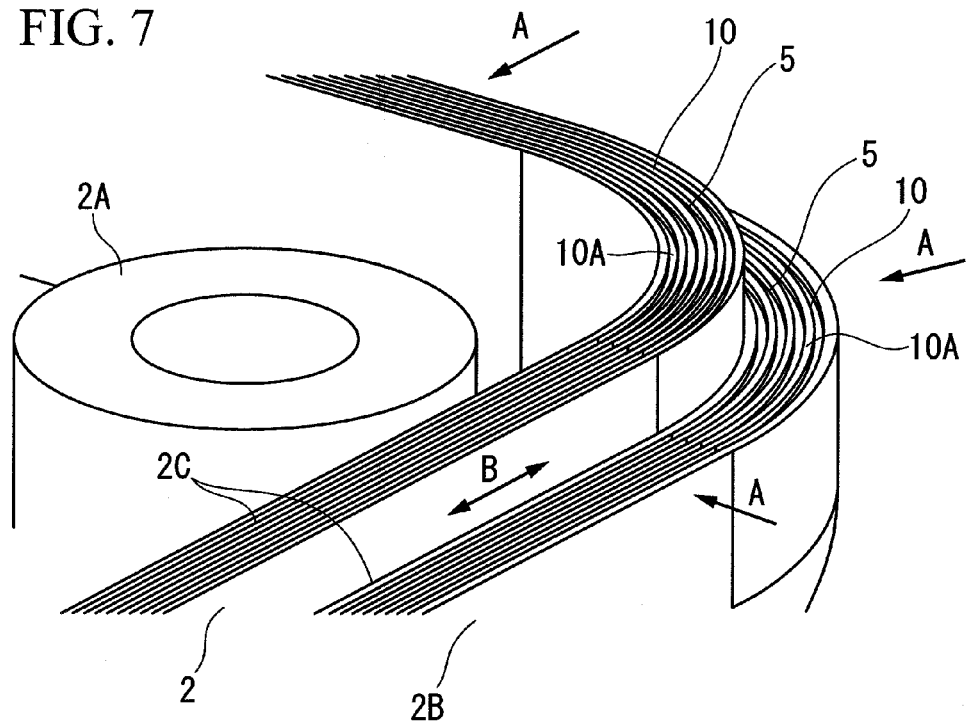
FIG. 7 is an enlarged perspective view showing a water repellent slit of the lower casing of the casing shown in FIG. 1.

FIG. 6 is a perspective view of the lower casing 2. FIG. 7 is an enlarged perspective view showing the facing surface 5 on the step 2C of the lower casing 2. As shown in detail in FIG. 7, on this facing surface 5, there is formed a water repellent slit 10 with a number of fine slit grooves 10A extending in a direction orthogonal to the ingress direction of a liquid droplet W (a the direction of arrow A), and along the periphery parts 2B and 3B of the casings 2 and 3.

As the slit spacing in this water repellent slit 10 becomes narrower, the level of water repellent effect to be exerted becomes higher. When manufacturing the casing 1 by means of injection molding, the shape of the fine slit grooves 10A is likely to change due to wear in the mold. Therefore, when manufacturing by means of injection molding, a preferred slit width of the slit grooves 10A is within an approximate range of 0.05 mm to 0.1 mm Recesses and protrusions even with this level of slit width are sufficiently expected to yield an increase in water repellent effect of the water repellent slit 10.

The slit shape of this type of water repellent slit 10 may be formed by means of a transfer method in a post-process after the casing 1 has been injection-molded. In this case, it can be specialized for slit portion molding, and therefore, the slit width can be processed at several tens of micrometers to several micrometers level.

In FIG. 6 and FIG. 7, there is described the water repellent slit 10 formed on the facing surface 5 on the step 2C of the lower casing 2. As shown in FIG. 5, also on the facing surface 6 on the step 3C of the upper casing 3, there is formed a water repellent slit 11 having similar fine slit grooves 11A. When the upper casing 3 and the lower casing 2 are combined with each other, the water repellent slit 10 and the water repellent slit 11 are arranged so as to oppose each other via the gap 7.

Figure 8:
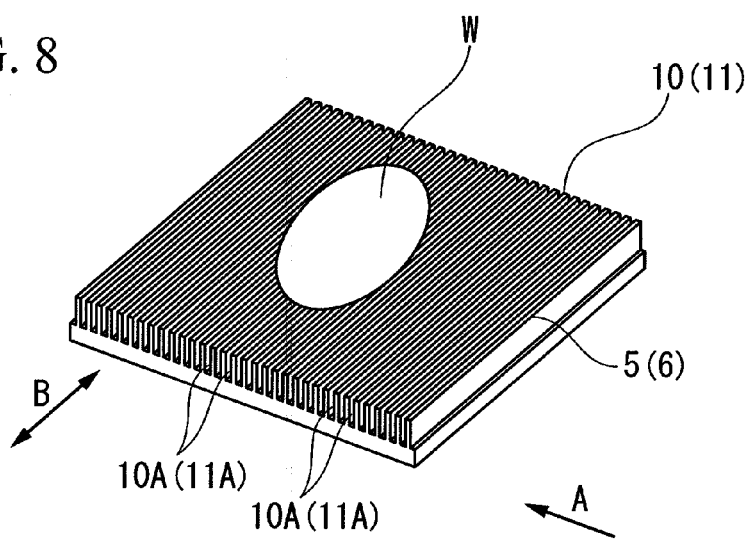
FIG. 8 is a perspective view showing a state where a liquid droplet is present on the upper surface of the water repellent slit according to the present invention.
Figure 9A:
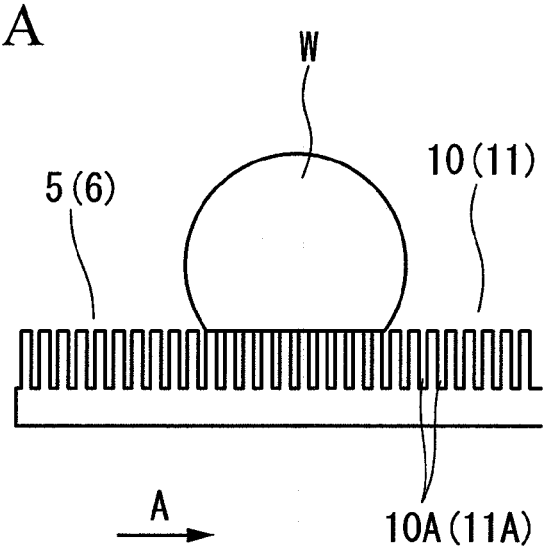
FIG. 9A is a diagram showing the liquid droplet illustrated in FIG. 8 seen from the side along the lengthwise direction of the slit.
Figure 9B:
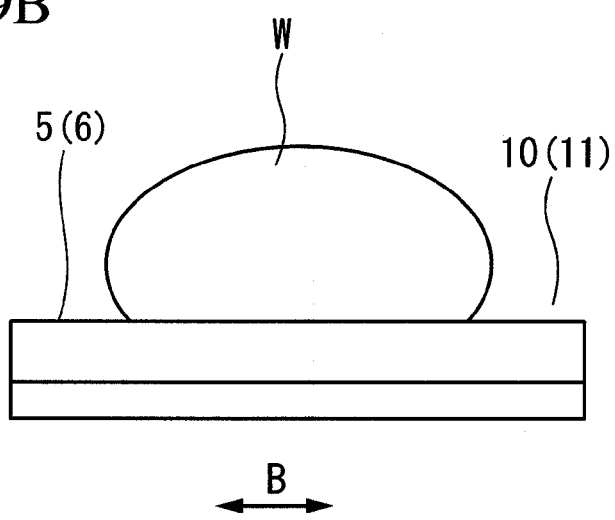
FIG. 9B is a diagram of the liquid droplet illustrated in FIG. 8 seen from the ingress direction.

With reference to FIG. 8, FIG. 9A, and FIG. 9B, there is described in detail a contact angle between the facing surface 5 having the water repellent slit 10 or the facing surface 6 having the water repellent slit 11, and a liquid droplet W on the upper surface thereof. These diagrams illustrate water repellency of the water repellent slits 10 and 11 according to the present exemplary embodiment. The water repellent slit 10 (11) has fine slit grooves 10A (11A) along the periphery part 2B (3B) of the casing 2 (3). This type of slit grooves 10A (11A) create anisotropism in the contact angle between the facing surface 5 (6) and the liquid droplet W, and the shape of the liquid droplet W consequently becomes oval. That is to say, in this type of water repellent slit 10 (11), as shown in FIG. 9A and FIG. 9B, while the apparent contact angle can be made approximately 140° in relation to the direction perpendicular to the slit grooves 10A (11A) formed on the water repellent slit 10 (11) (the direction of arrow A the same as the ingress direction of the liquid droplet W), the apparent contact angle in relation to the direction along the slit grooves 10A (11A) formed on the water repellent slit 10 (11) (the direction of arrow B) is approximately 110° as has been observed. Thereby, the liquid droplet W is made anisotropic, and the shape of the liquid droplet W is made oval.

Accordingly, while a high level of water repellency can be realized with respect to the direction of the liquid droplet W entering the gap 7 between the facing surface 5 of the lower casing 2 and the facing surface 6 of the upper casing 3 (the direction of arrow A), it is possible to suppress water repellency in relation to the direction along the slit grooves 10A and 11A, which is perpendicular to the ingress direction (the direction of arrow B along the slit grooves 10A and 11A). As a result, the liquid droplet W which has entered the gap 7 becomes oval-shaped, and therefore, the superficial area of the liquid droplet W can be made larger. Consequently it becomes possible to quickly evaporate the entered liquid droplet W. Furthermore, the liquid droplet W can easily move in the direction (the direction of arrow B) along the slit grooves 10A and 11A, and the entered liquid droplet W can be guided to the outside of the casing 1 via the slit grooves 10A and 11A.

Figure 10A:
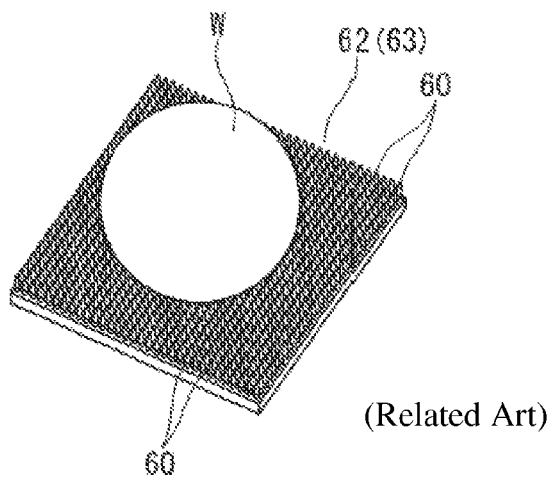
FIG. 10A is a perspective view of a liquid droplet in a state of being present on the upper surface of a conventional water repellent slit, seen from the upper side.
Figure 10B:
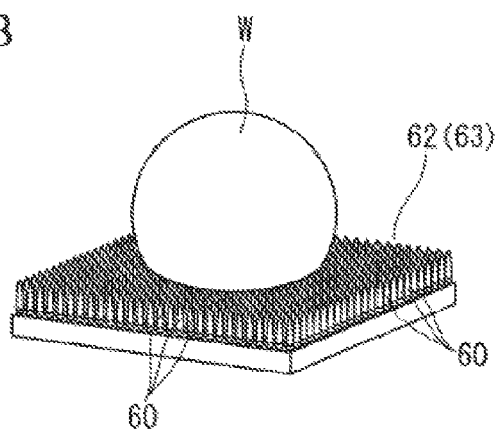
FIG. 10B is a perspective view of a liquid droplet in a state of being present on the upper surface of the conventional water repellent slit, seen from the obliquely upper side.
Figure 11:
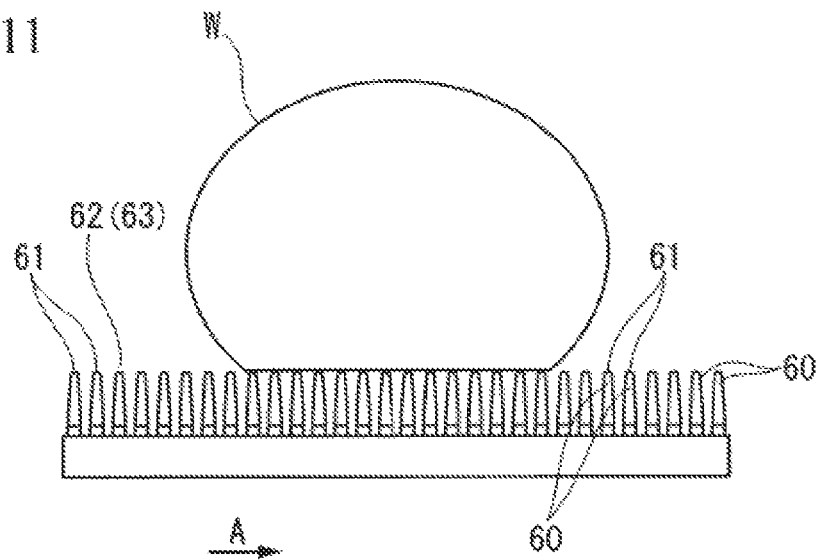
FIG. 11 is a diagram of a liquid droplet in a state of being present on the upper surface of the conventional water repellent slit, seen from a side.

On the other hand, FIG. 10A, FIG. 10B, and FIG. 11 show a conventional waterproof structure with a surface having acicular protrusions, which is compared to the water repellent slits 10 and 11 according to the first exemplary embodiment. In this type of waterproof structure, acicular protrusions 60 are arranged in matrix form, and the tip end part 61 of the acicular protrusions 60 supports the liquid droplet W, thereby improving apparent water repellency. In this type of waterproof structure with acicular protrusions in matrix form, anisotropism shown in FIG. 8, FIG. 9A, and FIG. 9B will not occur. As a result, the entered liquid droplet W becomes circular shaped, and therefore, the superficial area of the liquid droplet W will not become larger. Therefore, the liquid droplet W will not quickly evaporate. As a result, in those cases where the portable device is accidentally dropped into water while using it in rainy weather, it may be considered that water may infiltrate into the interior through a gap of approximately 0.2 mm or less formed between facing surfaces 62 and 63, which possess the acicular protrusions 60. In this type of case, it is considered that water may infiltrate into the interior causing the electrical circuit to be short-circuited, and the portable device may stop functioning as a result. However, in the present exemplary embodiment, it is possible, with the water repellency of the water repellent slits 10 and 11, to prevent a liquid droplet W from entering thereinto.

Moreover, in the case with only the conventional water repellent process, even if the exterior of the casing is completely wiped after water becomes attached thereon, fine liquid droplets W attached in the gap cannot be wiped off. Therefore, since the liquid droplets W still remain inside the casing even if water ingress is temporarily prevented, there is a possibility that oxidation degradation may occur due to the rising level of humidity inside and short-circuit may occur due to the liquid droplet W eventually entering into the interior. However, in the water repellent slits 10 and 11 of the present exemplary embodiment, the liquid droplets W disperse with respect to the slit direction (the direction of arrow B), and it is thereby possible to keep the influence of these remaining liquid droplets W at a minimum level.

Water repellency is dependent on the surface shape. In a case where the acicular protrusions 60 are provided as shown in FIG. 10A, FIG. 10B, and FIG. 11, there is a disadvantage in that the tip end part 61 of the acicular protrusions 60 are prone to be damaged during assembly. On the other hand, in the case of providing a slit shape as shown in the present exemplary embodiment, the water repellent slits 10 and 11 are of a continuous shape and are thus resistant to deformation. Therefore, at the time of assembly or when deformed as a result of an external force being applied to the casing 1 after the assembly, the water repellent slits 10 and 11 of the present exemplary embodiment are resistant also to frictions which occur between the lower casing 2 and the upper casing 3.

As the material of the casing 1, it is preferable to select a material with a property such that the contact angle between the facing surface 5 (6) and the liquid droplet W on the upper surface thereof is 90° or more due to the water repellency of the material itself. For example, if a polycarbonate based water repellent resin material is used, the contact angle between the facing surface without a water repellent slit such as one according to the present exemplary embodiment and the liquid droplet W on the upper surface thereof is approximately 100° due to the water repellency of the material itself. Therefore, a polycarbonate based water repellent resin material is an excellent material. In the case where the water repellent slit 10 (11) having the slit grooves 10A (11A) on the facing surface 5 (6) is provided, the contact angle between the facing surface 5 (6) and the liquid droplet W on the upper surface thereof is 130° or more. That is to say, the contact angle is greater by 30° or more, and water repellent performance can be improved. That is to say, by selecting a water repellent resin material for the material for the casing 1 having the abovementioned water repellent slit 10 (11) formed thereon, it is possible to further increase the contact angle between the facing surface 5 (6) and the liquid droplet W on the upper surface thereof.

Even in a case where a normal resin material with no water repellency is used, by simply coating the upper surface of a facing surface without a water repellent slit such as one according to the present exemplary embodiment, with a fluorine based water repellent material (described later, with reference to FIG. 19A through FIG. 19C) to serve as a water repellent film, the contact angle between the facing surface and the liquid droplet W on the upper surface thereof can be made approximately 110°. Accordingly, if this water repellent film is coated on the facing surface 5 (6) of the casing 1 having the abovementioned water repellent slit 10 (11) formed thereon, the apparent contact angle can be made approximately 140° in relation to the direction perpendicular to the slit formed on the water repellent slit 10 (11) shown in this first exemplary embodiment (the direction of arrow A the same as the ingress direction of the liquid droplet W), and a high level of water repellent effect can be obtained.

According to the waterproof structure shown in the present exemplary embodiment, as described above in detail, the following advantages (1) through (6) can be obtained with a configuration such that on the facing surface 5 (6) of the lower casing 2 (upper casing 3) which constitutes the casing 1, there is provided a water repellent slit 10 (11) which extends in one direction orthogonal to the ingress direction of a liquid droplet W (the direction of arrow A) and which has unidirectional recesses and protrusions that make water repellency anisotropic.

(1) According to the waterproof structure of the present exemplary embodiment, it is possible to increase the level of water repellency in relation to the ingress direction of a liquid droplet W (the direction of arrow A). According to the waterproof structure of the present exemplary embodiment, a higher level of water repellent performance can be provided compared to that of a normal water repellent film. When comparing it in terms of contact angle, according to the waterproof structure of the present exemplary embodiment, the contact angle is expected to be greater than that with a normal water repellent film by approximately 10° to 30°. As a result, in a case where the contact angle between water and a water repellent film coated on a flat surface with nothing applied thereon is 120°, it is possible to make the contact angle 130° to 150° according to the waterproof structure of the present exemplary embodiment.

(2) The waterproof structure of the present exemplary embodiment is highly resistant to deformation caused by external forces and is capable of maintaining water repellent performance for a prolonged period of time, compared to conventional waterproof structures having fine acicular protrusions, which are prone to deformation which may deteriorate the level of water repellent performance.

(3) With the waterproof structure of the present exemplary embodiment, water repellent properties can be expected due to the shape of the recesses and protrusions on the surface, even without a water repellent film coating. At this time, if the recesses and protrusions on the slit grooves 10A (11A) are miniaturized to scale dimensions of 1 micrometer or less and made highly dense, a high level of water repellency and directivity can be obtained regardless of materials. Moreover, with use of a fluorine based resin or a material such as a simple resin with contact angle of 90° or more, a sufficiently high level of water repellency can be obtained even if the surface recesses and protrusions are of micrometers scale dimensions.

(4) According to the waterproof structure of the present exemplary embodiment, while a high level of water repellency is realized in relation to the direction of the liquid droplet W entering the gap 7 between the facing surface 5 of the lower casing 2 and the facing surface 6 of the upper casing 3 (the direction of arrow A), it is possible to suppress water repellency in relation to the direction along the slit grooves 10A and 11A, which is perpendicular to the ingress direction (the direction of arrow B). As a result, the liquid droplet W entering the gap 7 becomes oval-shaped, and the superficial area of the liquid droplet W becomes greater. Accordingly, it is possible to quickly evaporate the entered liquid droplet W.

(5) According to the waterproof structure of the present exemplary embodiment, it is possible to easily move the liquid droplet W in the direction along the slit grooves 10A and 11A (the direction of arrow B). Therefore, the entered liquid droplet W can be guided to the outside of the lower casing 2 and the upper casing 3.

(6) Since the waterproof structure of the present exemplary embodiment is basically not different from that in conventional casing structures, it is possible to maintain the conventional level of portability and design while additionally providing waterproof performance.

Figure 12:
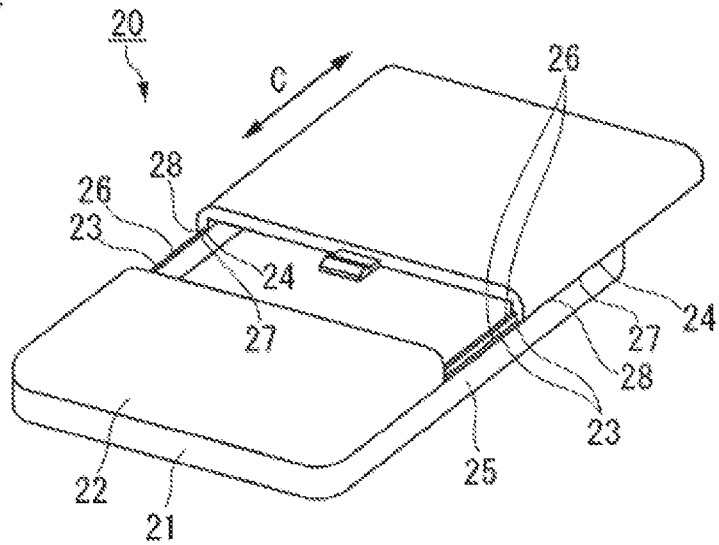
FIG. 12 is a perspective view showing an external appearance of a casing of a portable device according to a modified exemplary embodiment of the present invention.

The casing 1 of the first exemplary embodiment above is of a type such that the lower casing 2 and the upper casing 3 which constitute the casing members are fixed in a state of being joined with each other, by the screws 4. However, the waterproof structure of the present exemplary embodiment is not limited to a configuration of providing the water repellent slit 10 (11) on the facing surface 5 (6) of this type of lower casing 2 (upper casing 3). For example, the waterproof structure of the present exemplary embodiment may be applied as shown in FIG. 12. That is to say, on a facing surface 23 of a lower casing 21 and a facing surface 24 of an upper casing 22 which constitute a casing 20, there is provided a slide mechanism 25 in which the facing surface 23 of the lower casing 21 and the facing surface 24 of the upper casing 22 slide on each other along the direction of arrow C. On the facing surfaces 23 and 24, there are provided water repellent slits 26 and 27 similar to the water repellent slits 10 and 11 described above. In general, in the slide mechanism 25, nimble movements can be made by providing a gap 28 between the facing surface 23 and the facing surface 24. However, in a case of forming a slide mechanism 25 with a generic waterproof structure, it needs to resist repulsive forces, which occur as a result of a sealing member such as rubber packing being compressed. As a result, frictional forces occur and prevent nimble movements. In contrast, in the present exemplary embodiment, no sealing member intervenes between the facing surface 23 of this lower casing 21 and the facing surface 24 of this upper casing 22, and water repellent slits 26 and 27 are arranged with the gap 28 therebetween. As a result, an effect similar to that of the water repellent slits 10 and 11 described above can be obtained. Furthermore, waterproofness is ensured while frictional forces are suppressed when a sliding action is being performed and nimble movements are ensured, and furthermore, there can be obtained an effect such that wear due to friction will not be observed.

In FIG. 12, the water repellent slits 26 and 27 described above are provided respectively on both the facing surface 24 of the upper casing 22 and the facing surface 23 of the lower casing 21. However, even if the water repellent slit 26 or 27 is provided only on either one of the facing surfaces 23 and 24, the above effect can be obtained. However, by providing the water repellent slits 26 and 27 described above respectively on both of the facing surface 24 of the upper casing 22 and facing surface 23 of the lower casing 21, the amount of time that a liquid droplet takes to enter the interior can be prolonged and a higher level of waterproof effect can be obtained.

[Second Exemplary Embodiment]

A second exemplary embodiment of the present invention is described, with reference to FIG. 13 through FIG. 19C. The second exemplary embodiment is an example of the present invention being applied to a portable telephone terminal in which an upper casing and a lower casing are joined by means of a rotation hinge.

Figure 13:
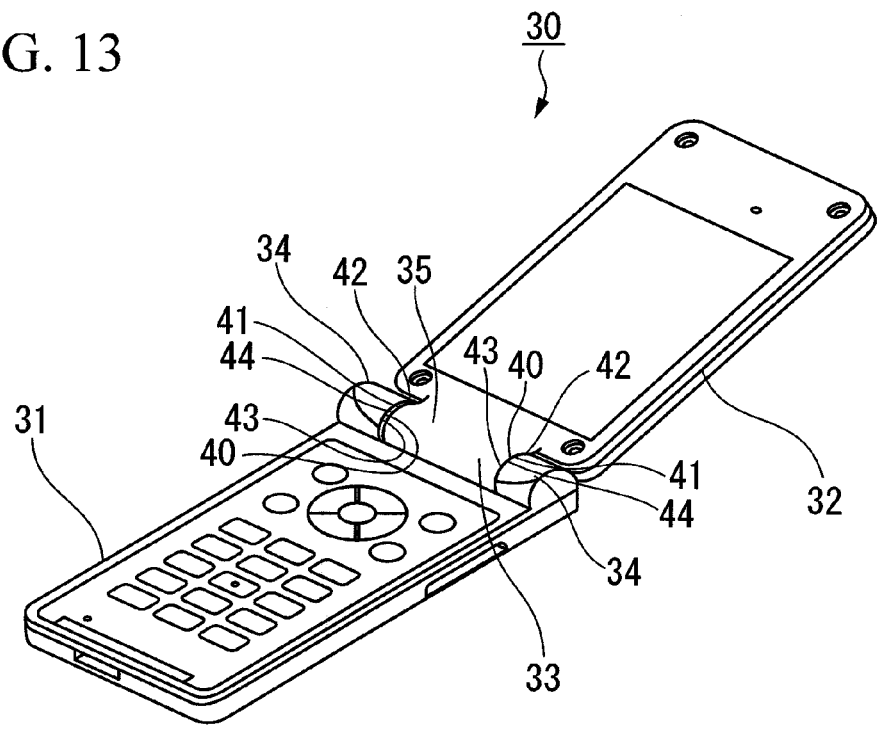
FIG. 13 is a perspective view showing an external appearance of a casing of a portable device according to a second exemplary embodiment of the present invention.
Figure 14:
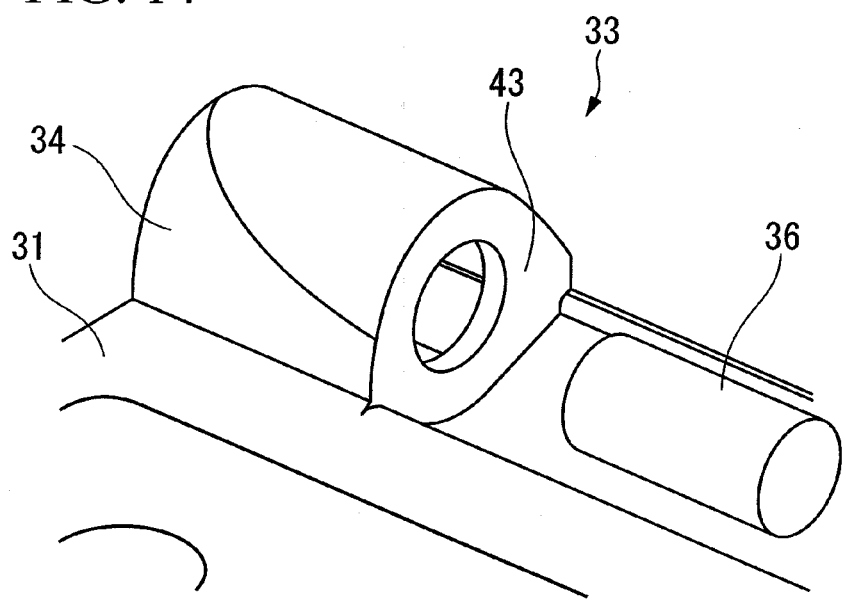
FIG. 14 is a perspective view showing a bearing portion of a lower casing of the casing shown in FIG. 13 which serves as a casing member.
Figure 15A:
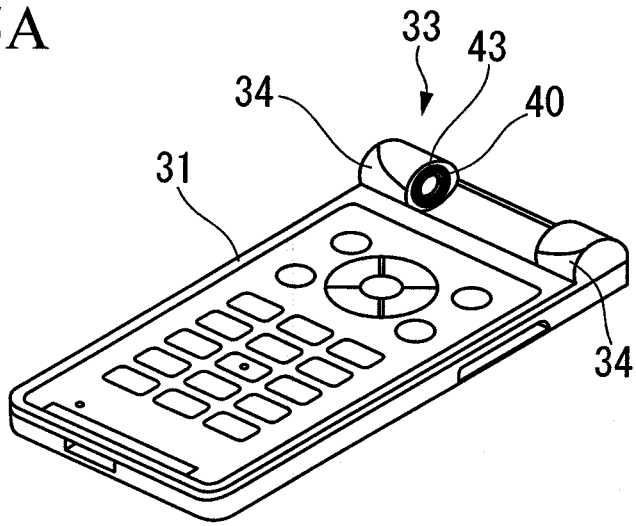
FIG. 15A is a perspective view showing the entirety of the lower casing of the casing shown in FIG. 13.
Figure 15B:
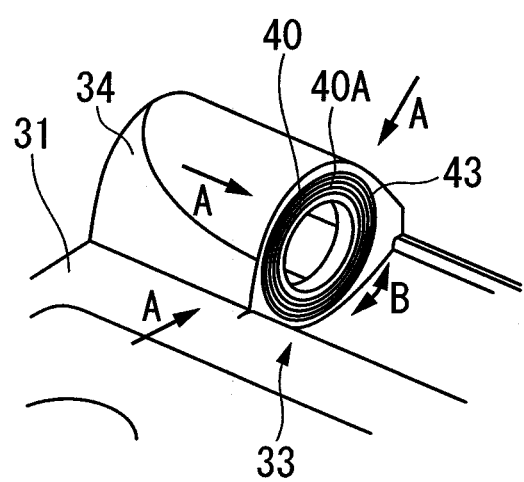
FIG. 15B is an enlarged perspective view showing the bearing portion of the lower casing of the casing shown in FIG. 13.
Figure 16:
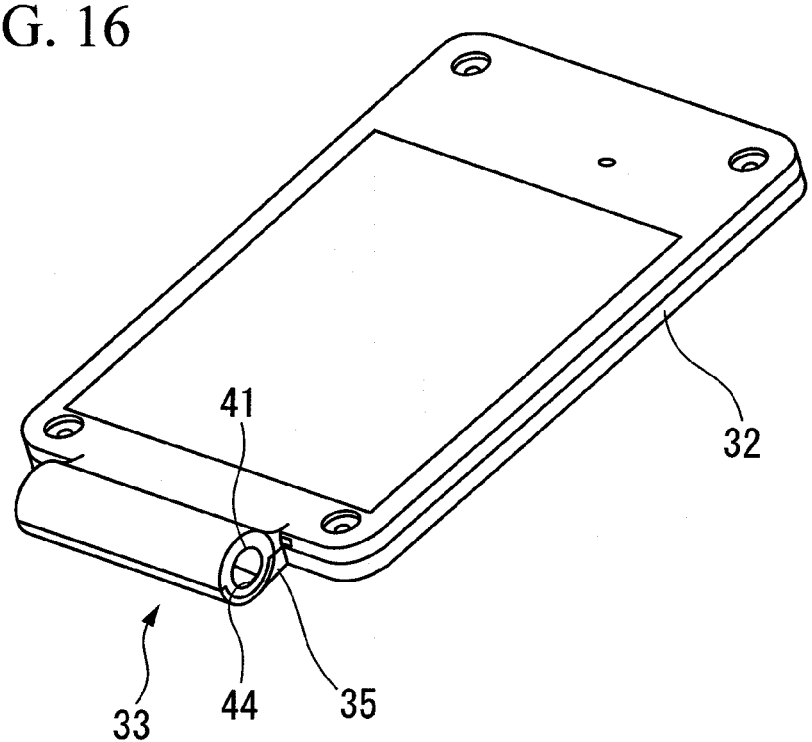
FIG. 16 is a perspective view showing an upper casing which serves as a casing member of the casing shown in FIG. 13.
Figure 17A:
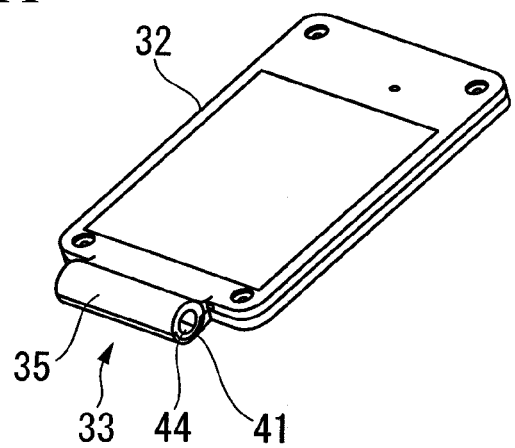
FIG. 17A is a perspective view showing the entirety of the upper casing of the casing shown in FIG. 13.
Figure 17B:
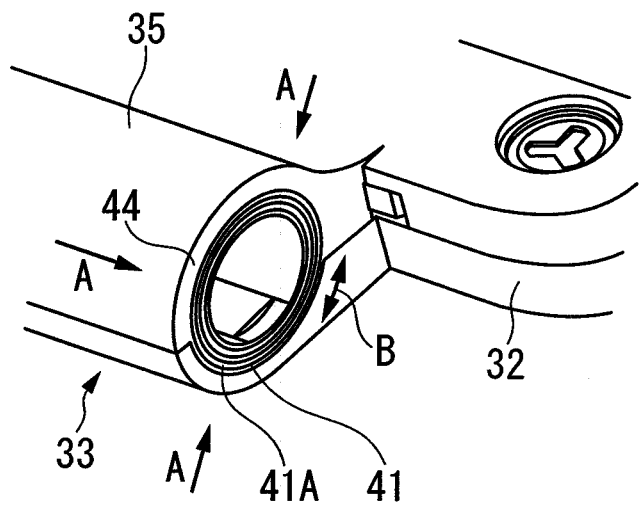
FIG. 17B is an enlarged perspective view showing a bearing portion of the upper casing of the casing shown in FIG. 13.

FIG. 13 shows a representative example of a portable terminal having a rotation hinge. A casing 30 shown in FIG. 13 is such that a lower casing 31 and an upper casing 32 which constitute the casing members are rotatably supported at a rotation part 33 which serves as a hinge.

FIG. 14 through FIG. 17B are enlarged views of this rotation part 33. This rotation part 33 includes a bearing part 34 provided integrated with the lower casing 31, a bearing part 35 provided integrated with the upper casing 32, and a cylindrical shaft member 36 supported on these bearing parts 34 and 35. With this type of rotation part 33, the upper casing 32 operates to open and close with respect to the lower casing 31, and there is generated a torque for holding it at a predetermined opening degree when an opening or closing action is being performed.

Next is a description of water repellent slits 40 and 41 provided on the bearing part 34 of the lower casing 31 and on the bearing part 35 of the upper casing 32.

As shown in FIG. 15A through FIG. 17B, the water repellent slits 40 and 41 are provided respectively on facing surfaces 43 and 44. The facing surface 43 and the facing surface 44 are arranged as being opposed to each other so as to have a gap 42 of up to approximately 0.2 mm (refer to FIG. 13) therebetween at the bearing part 34 and the bearing part 35 positioned around the periphery of the shaft member 36. The bearing slits 40 and 41 respectively includes fine slit grooves 40A and 41A along the direction orthogonal to the liquid droplet ingress direction (shown with arrow A) so as to form, around the shaft part 36, a shape concentric or semi-concentric thereto.

The water repellent slit 40 (41) of this second exemplary embodiment is such that on the facing surface 43 (44) of the lower casing 31 (upper casing 32) which constitutes the casing 30, there is formed a water repellent slit 10 (11) having unidirectional recesses and protrusions that make water repellency anisotropic, in the direction orthogonal to the ingress direction of a liquid droplet W (the radial direction shown with the direction of arrow A). Therefore, according to the water repellent slits 40 and 41 of the second exemplary embodiment, it is possible to increase the level of water repellency with respect to the ingress direction of a liquid droplet W (the direction of arrow A), and a higher level of water repellent performance can be provided compared to that of a normal water repellent film. Furthermore, according to the water repellent slits 40 and 41 of the second exemplary embodiment, there can be obtained an operation and effect similar to those of the water repellent slits 10 and 11 of the first exemplary embodiment described above.

Moreover, in the water repellent slits 40 and 41 of this second exemplary embodiment, there are respectively formed slit grooves 40A and 41A in a form concentric, in the arrow B direction, to the shaft member 36. As a result, there is an advantage in that water ingress toward the axial center is prevented, the liquid droplets W are dispersed in the direction of rotation of the upper casing 32 with respect to the lower casing 31, and the level of resistance to wear caused by rotation is extremely high.

In FIG. 15A through FIG. 17B, the water repellent slits 40 and 41 described above are provided respectively on both the facing surface 43 of the lower casing 31 and the facing surface 44 of the upper casing 32. However, even if the water repellent slit 40 or 41 is provided only on either one of the facing surfaces 43 and 44, the above effect can be obtained. In the second exemplary embodiment, there has been illustrated an example in which the water repellent slits 40 and 41 are provided on the rotation part 33 which serves as a hinge of the casing 30 of the portable device. However, the waterproof structure of the second exemplary embodiment can be sufficiently applied also to a generic hinge mechanism.

Specific examples of the shape of the water repellent slits 10, 11 and the water repellent slits 26, 27 shown in the first exemplary embodiment and the water repellent slits 40 and 11 shown in the second exemplary embodiment include shapes illustrated in FIG. 18A through FIG. 18D (the water repellent slit 10 is taken as an example in these diagrams).

Figure 18A:
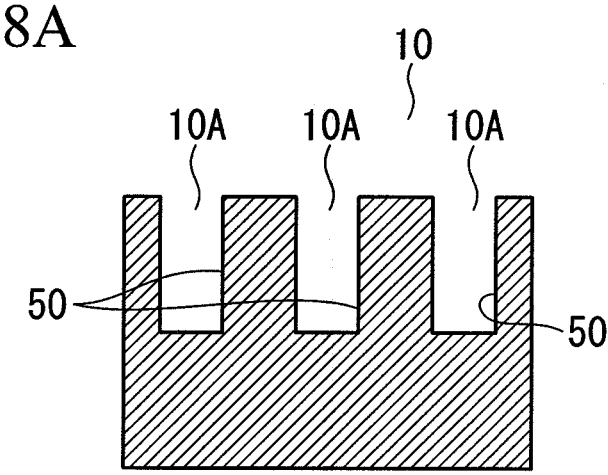
FIG. 18A is an enlarged view of a slit part of the water repellent slit according to the exemplary embodiment of the present invention, being a cross-sectional view of the slit in a form in which a wall surface is orthogonal to the direction of liquid droplet ingress.
Figure 18B:
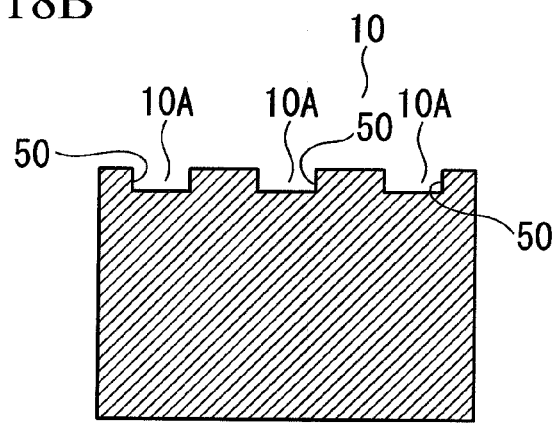
FIG. 18B is an enlarged view of a slit part of the water repellent slit according to the exemplary embodiment of the present invention, being a cross-sectional view of a shallow slit.
Figure 18C:
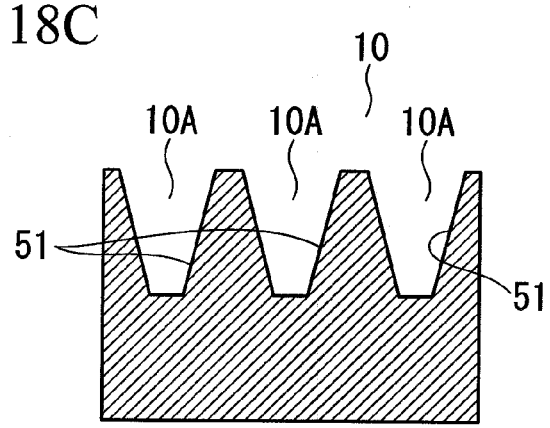
FIG. 18C is an enlarged view of a slit part of the water repellent slit according to the exemplary embodiment of the present invention, being a cross-sectional view of a slit with oblique wall surfaces.
Figure 18D:
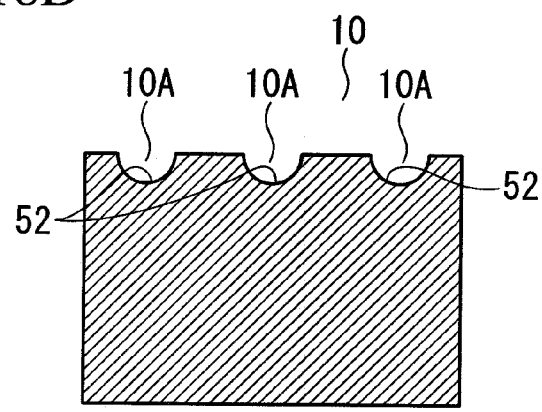
FIG. 18D is an enlarged view of a slit part of the water repellent slit according to the exemplary embodiment of the present invention, being a cross-sectional view of a slit with arc-shaped wall surfaces.

FIG. 18A and FIG. 18B show wall surfaces 50 of slit grooves 10A which are formed as being perpendicular to the ingress direction of a liquid droplet W (the direction of arrow A). FIG. 18A shows a water repellent slit 10 having slit grooves 10A in which the grooves are deep. FIG. 18B shows a water repellent slit 10 having slit grooves 10A in which the grooves are shallow. FIG. 18C shows wall surfaces 51 of slit grooves 10A which are angled with respect to the ingress direction of a liquid droplet W (the direction of arrow A). FIG. 18D shows wall surfaces 52 of slit grooves 10A which are formed in an arc shape.

The width of the slit grooves 10A shown in these FIG. 18A through FIG. 18D is to be selected within a range of micrometer level to millimeter level, taking into consideration the corresponding gap, application, and manufacturing limitations. As shown in these figures, the cross-sectional shape of the water repellent slit 10 is selected from various types of shapes including rectangular sectional shape and circular sectional shape, depending on the circumstances of use.

Figure 19A:
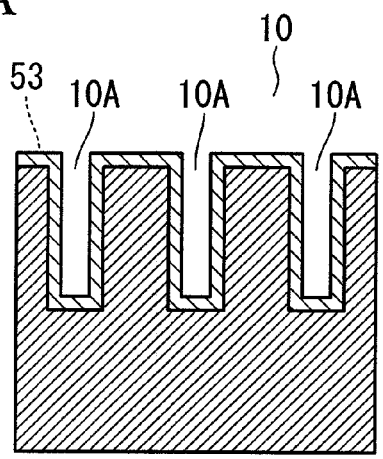
FIG. 19A is a cross-sectional view of a slit according to the exemplary embodiment of the present invention in which a water repellent film is provided on the entire surface thereof.
Figure 19B:
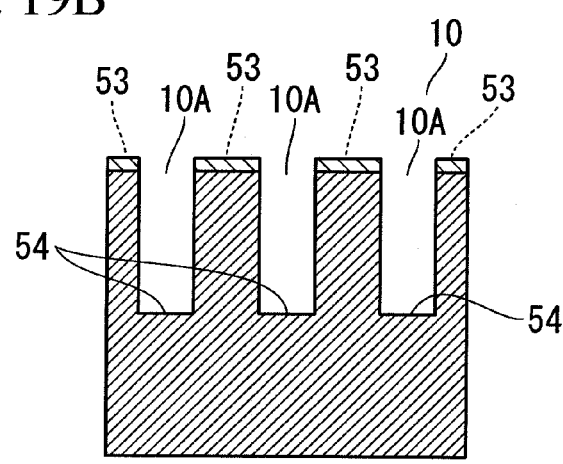
FIG. 19B is a cross-sectional view of a slit according to the exemplary embodiment of the present invention in which a water repellent film is provided on exposed portions thereof.
Figure 19C:
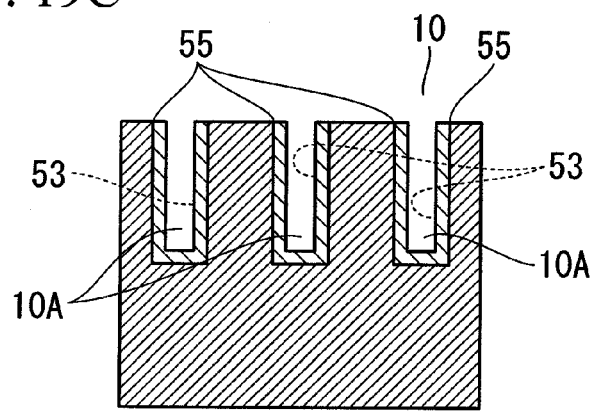
FIG. 19C is a cross-sectional view of a slit according to the exemplary embodiment of the present invention in which a water repellent film is provided inside grooves thereof.

FIG. 19A through FIG. 19C respectively show a state where the slit surface of the water repellent slits 10, 11 and the water repellent slits 26, 27 shown in the first exemplary embodiment, and the water repellent slits 40 and 41 are coated with a fluorine based polymer, a fluorine based monomolecular, a silica based inorganic polymer, a ceramic coating film, or a water repellent film 53 containing any of these (the water repellent slit 10 is taken as an example in these figures).

Basically, a pattern of coating the entire surface with the water repellent film 53 as shown in FIG. 19A is preferable. When the slit width is small, there may be a pattern of coating the water repellent film 53 only on the portions exposed to the front side as shown in FIG. 19B, or a pattern shown in FIG. 19C due to friction on the exposed surface portions.

With the pattern of FIG. 19B, a liquid droplet W may enter a bottom part 54 of the slit grooves 10A in some cases. However, this will not be a major issue as long as the entirety is not completely immersed in water and water enters partial and limited areas.

The pattern of FIG. 19C illustrates a state where the inside of the bottom part of the slit grooves 10A are coated with the water repellent film 53. Accordingly, in this pattern, each corner part 55 serves as a point of changing from being hydrophilic to being water repellent with respect to ingress of the liquid droplets W, and these changing points are expected to stop water ingress.

In the first exemplary embodiment and the second exemplary embodiment described above, the casings 1, 20, and 30 are respectively configured with a pair of casing members (lower casing and upper casing), however, the configurations are not limited to these. For example, the casings 1, 20, and 30 may be configured with three or more casing members, and a water repellent slit may be provided between the casing members.

The exemplary embodiments of the present invention have been described in detail, with reference to the drawings. However, specific configurations are not limited to these exemplary embodiments, and design modifications may be made without departing from the scope of the invention.

This application is based upon and claims the benefit of priority from Japanese patent application No. 2009-098973, filed Apr. 15, 2009, the disclosure of which is incorporated herein in its entirety by reference.

INDUSTRIAL APPLICABILITY

The present invention may be applied to a casing of a portable device such as a potable telephone, a portable information terminal, a digital camera, and a laptop type personal computer.

REFERENCE SYMBOLS

1 Casing
2 Lower casing (casing member)
3 Upper casing (casing member)
5 Facing surface
6 Facing surface
7 Gap
10 Water repellent slit
10A Slit groove 11 Water repellent slit
11A Slit groove
20 Casing
21 Lower casing (casing member)
22 Upper casing (casing member)
23 Facing surface
24 Facing surface
26 Water repellent slit
27 Water repellent slit
28 Gap
30 Casing
31 Lower casing (casing member)
32 Upper casing (casing member)
33 Rotation part
36 Shaft member (rotation shaft)
40 Water repellent slit
40A Slit groove
41 Water repellent slit
41A Slit groove
42 Gap
43 Facing surface
44 Facing surface
50 Wall surface
51 Wall surface
52 Wall surface

The invention claimed is:

1. A waterproof structure, comprising:
a casing including
a first case member having a first facing surface, and
a second case member having a second facing surface,
the first and second facing surfaces facing one another,
the first facing surface having
a first upper surface,
a first lower surface, and
a first middle surface,
the first lower surface being positioned below the first upper surface,
the first upper and lower surfaces forming a first step,
the first middle surface being positioned between the first upper and lower surfaces,
the second facing surface having
a second upper surface,
a second lower surface, and
a second middle surface,
the second lower surface being positioned below the second upper surface,
the second upper and lower surfaces forming a second step,
the second middle surface being positioned between the second upper and lower surfaces and facing the first middle surface,
the second upper surface facing the first upper surface and being positioned above the first lower surface,
the second lower surface facing the first lower surface; and
a water repellent slit provided in each of the first upper surface, the first lower surface, the second upper surface, and the second lower surface, the water repellent slit extending in a direction in which each of the first and second facing surfaces extends, the direction in which the water repellent slit extends being perpendicular to a direction of liquid droplet ingress, the water repellent slit having unidirectional fine recesses and protrusions that make water repellency anisotropic,
wherein distal ends of the protrusions on the first upper surface are above distal ends of the protrusions on the second upper surface, and
wherein positions of the protrusions on the first upper surface are offset with respect to positions of the protrusions on the second upper surface when viewed from a direction perpendicular to the first upper surface, and
wherein positions of the protrusions on the first lower surface are aligned with respect to positions of the protrusions on the second lower surface along the direction in which the water repellent slit extends when viewed from a direction perpendicular to the first lower surface.

2. The waterproof structure according to claim 1, wherein a gap between the first facing surface and the second facing surface is set to a width up to 0.2 mm.

3. The waterproof structure according to claim 1, wherein the casing member is made of a water repellent resin a contact angle of which with respect to a liquid droplet is 90° or more.

4. The waterproof structure according to claim 1, wherein the first and second facing surfaces are respectively formed in a rotation part of the first and second casing members.

5. The waterproof structure according to claim 4, wherein the water repellent slit is of a shape concentric or semi-concentric to a rotation shaft of the rotation part.

6. The waterproof structure according to claim 1, wherein a wall surface which forms a slit groove of the water repellent slit is provided as being orthogonal to the direction of liquid droplet ingress.

7. The waterproof structure according to claim 1, wherein a wall surface which forms a slit groove of the water repellent slit is provided as being angled with respect to the direction of liquid droplet ingress.

8. The waterproof structure according to claim 1, wherein a wall surface of a slit groove of the water repellent slit is formed in an arc shape.

9. The waterproof structure according to claim 1, wherein the first facing surface is provided at a periphery of the first case member, and the second facing surface is provided at a periphery of the second case member.

10. The waterproof structure according to claim 1, further comprising a plurality of water repellent slits.

11. The waterproof structure according to claim 1, wherein the unidirectional fine recesses and protrusions make water repellency anisotropic in the extending direction of the fine recesses and the protrusions of the water repellent slit.

12. The waterproof structure according to claim 1, wherein the positions of the protrusions on the first upper surface correspond with the positions of the recesses in the second upper surface along the direction in which the water repellent slit extends when viewed from the direction perpendicular to the first upper surface.

13. A waterproof structure, comprising:
a casing including
a first case member having a first facing surface, and
a second case member having a second facing surface,
the first and second facing surfaces facing one another,
the first facing surface having
a first upper surface,
a first lower surface, and
a first middle surface,
the first lower surface being positioned below the first upper surface,
the first upper and lower surfaces forming a first step, the first middle surface being positioned between the first upper and lower surfaces, the second facing surface having
a second upper surface,
a second lower surface, and
a second middle surface,
the second lower surface being positioned below the second upper surface,
the second upper and lower surfaces forming a second step,
the second middle surface being positioned between the second upper and lower surfaces and facing the first middle surface,
the second upper surface facing the first upper surface and being positioned above the first lower surface, the second lower surface facing the first lower surface;

a gap defined between the first and second facing surfaces; and a water repellent slit provided in each of the first upper surface, the first lower surface, the second upper surface, and the second lower surface, the water repellent slit extending in a direction in which each of the first and second facing surfaces extends, the direction in which the water repellent slit extends being perpendicular to a direction of liquid droplet ingress, the water repellent slit having unidirectional fine recesses and protrusions that make water repellency anisotropic, wherein distal ends of the protrusions on the first upper surface are above distal ends of the protrusions on the second upper surface, wherein the unidirectional fine recesses and the protrusions extend from the gap defined between the first and second facing surfaces, and wherein positions of the protrusions on the first upper surface are offset with respect to positions of the protrusions on the second upper surface when viewed from a direction perpendicular to the first upper surface, and wherein positions of the protrusions on the first lower surface are aligned with respect to positions of the protrusions on the second lower surface along the direction in which the water repellent slit extends when viewed from a direction perpendicular to the first lower surface.

14. The waterproof structure according to claim 13, wherein the water repellent slits in the first lower surface and the water repellent slits in the second lower surface are opposite each other in relation to the gap.

15. The waterproof structure according to claim 13, wherein a width of each of the fine recesses is within a range of about 0.05 mm to about 0.1 mm.

16. A waterproof casing, comprising:
a first case member having a first facing surface and a second case member having a second facing surface, the first and second facing surfaces facing one another, the first facing surface having a first upper surface, a first lower surface, and a first middle surface, the first lower surface being below the first upper surface, the first upper and lower surfaces forming a first step, the first middle surface being between the first upper and lower surfaces, the second facing surface having a second upper surface, a second lower surface, and a second middle surface, the second lower surface being below the second upper surface, the second upper and lower surfaces forming a second step, the second middle surface being between the second upper and lower surfaces and facing the first middle surface, the second upper surface facing the first upper surface and being above the first lower surface, the second lower surface facing the first lower surface, each of the first upper surface, a first lower surface, the second upper surface, and the second lower surface having a multiplicity of annular grooves therein that form recesses and protrusions that make water repellency anisotropic, wherein distal ends of the protrusions on the first upper surface are above distal ends of the protrusions on the second upper surface, the distal ends on the first and second upper surfaces defining a gap therebetween that extends linearly across an entirety of the first and second upper surfaces, and wherein positions of the protrusions on the first upper surface are offset with respect to positions of the protrusions on the second upper surface when viewed from a direction perpendicular to the first upper surface, and wherein positions of the protrusions on the first lower surface are aligned with respect to positions of the protrusions on the second lower surface along the annular grooves in the first lower surface when viewed from a direction perpendicular to the first lower surface.

17. The waterproof casing of claim 16,
wherein distal ends of the protrusions on the first lower surface are above distal ends of the protrusions on the second lower surface, the distal ends on the first and second lower surfaces defining a gap therebetween that extends linearly across an entirety of the first and second lower surfaces.

* * * * *